(12) United States Patent
Raha et al.

(10) Patent No.: US 7,724,815 B1
(45) Date of Patent: May 25, 2010

(54) METHOD AND APPARATUS FOR A PROGRAMMABLY TERMINATED RECEIVER

(75) Inventors: Prasun K. Raha, Redwood City, CA (US); Dean Liu, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 732 days.

(21) Appl. No.: 11/711,520

(22) Filed: Feb. 27, 2007

(51) Int. Cl.
*H03H 7/30* (2006.01)
*H03H 7/40* (2006.01)
*H03K 5/159* (2006.01)

(52) U.S. Cl. .................. 375/230; 375/229; 375/350; 375/219; 375/220; 375/257; 708/322; 708/323; 708/300; 708/303

(58) Field of Classification Search .......... 375/230, 375/229, 350, 316, 219, 220, 222, 257; 708/322, 708/323, 300, 303
See application file for complete search history.

(56) References Cited

U.S. PATENT DOCUMENTS

| 7,106,099 B1* | 9/2006 | Nix .......................... 326/40 |
| 7,382,114 B2* | 6/2008 | Groom ..................... 323/271 |
| 7,539,244 B2* | 5/2009 | Thirunagari et al. ....... 375/232 |
| 2005/0058222 A1* | 3/2005 | Black et al. ............. 375/316 |

* cited by examiner

*Primary Examiner*—Phuong Phu
(74) *Attorney, Agent, or Firm*—Michael T. Wallace

(57) ABSTRACT

A method and apparatus for a receive equalizer of a gigabit transceiver that is reconfigurable to support multiple communication standards. Communication standards having variable common mode and coupling requirements are accommodated through the use of reconfigurable integrated circuits (ICs), such as field programmable gate arrays (FPGAs), that provide a plurality of reconfigurable transceivers that are programmable through configuration, or partial reconfiguration, events. The reconfigurable transceivers apply internally generated common mode voltage signals to the differential input in support of the various communication standards.

20 Claims, 3 Drawing Sheets

US 7,724,815 B1

METHOD AND APPARATUS FOR A PROGRAMMABLY TERMINATED RECEIVER

FIELD OF THE INVENTION

The present invention generally relates to gigabit serial receivers, and more particularly, to programmably terminated gigabit serial receivers.

BACKGROUND

Communication developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

Although the need for increased communication bandwidth continues to drive future designs, support for the lower bandwidth legacy systems still remains. As such, the future designs are required to provide a wide range of scalability, whereby data rate, slew rate, common-mode voltage, and many other physical (PHY) layer attributes are adaptable. For example, a particular transmitter/receiver pair may be configured for alternating current (AC) coupled, ground referenced signaling as is required by the PCI Express (PCIe) standard. Once configured, however, the same transmitter/receiver pair is precluded from supporting other transmission standards having different common mode requirements.

Efforts continue, therefore, to provide a single receive interface that supports multiple communication standards having various coupling and common mode requirements. In addition to providing the flexibility to handle multiple communication standards, the programmably terminated receive interface should not sacrifice signal integrity for those communication standards that do not require programmable terminations.

SUMMARY

To overcome limitations in the prior art, and to overcome other limitations that will become apparent upon reading and understanding the present specification, various embodiments of the present invention disclose an apparatus and method for a programmably terminated receive interface/equalizer for a gigabit receiver.

In accordance with one embodiment of the invention, an integrated circuit (IC) comprises a configurable logic fabric coupled to receive configuration data. The configurable logic fabric includes programmable logic devices and programmable interconnections that are configured to perform a logic function in response to the configuration data. The IC further includes a transceiver coupled to the configurable logic fabric and is coupled to receive a differential signal and the configuration data. The transceiver includes a receive interface that is coupled to receive the differential signal at first and second terminals. The receive interface is adapted to internally apply a programmable common mode signal to the first and second terminals in response to the configuration data. The IC further includes a receive equalizer that is coupled to the receive interface and is adapted to sum first and second phases of the differential signal.

In accordance with another embodiment of the invention, a programmable logic device (PLD) comprises a transceiver that is coupled to receive a differential signal and is coupled to receive configuration data during a configuration event of the PLD. The transceiver includes a receive interface that is coupled to receive the differential signal at first and second terminals. The receive interface is adapted to internally apply a programmable common mode signal to a first node in response to the configuration data. The first node is coupled to the first and second terminals through first and second programmable resistive elements. The PLD further includes a receive equalizer that is coupled to the receive interface and is adapted to sum first and second phases of the differential signal.

In accordance with another embodiment of the invention, a transmission system comprises a receiver that is coupled to receive differential data from a transmission medium. The receiver includes a configurable logic fabric that is coupled to receive configuration data. The configurable logic fabric includes programmable logic devices and programmable interconnections that are configured to perform a logic function in response to the configuration data. The PLD further includes a receive interface that is coupled to receive the differential data at first and second terminals. The receive interface is adapted to internally apply a programmable common mode signal in response to the configuration data. The PLD further includes a receive equalizer that is coupled to the receive interface and is adapted to sum first and second phases of the differential data.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to a receive equalizer of a gigabit transceiver that may be reconfigured to support multiple communication standards. In particular, communication standards having variable common mode and coupling requirements are accommodated through the use of reconfigurable integrated circuits (ICs), such as field programmable gate arrays (FPGAs), that provide a plurality of reconfigurable transceivers that are programmable through configuration, or partial reconfiguration, events.

In a first mode of operation, the reconfigurable transceivers may be programmed to support the PCI Express (PCIe) communication standard, whereby the receive equalizer of the reconfigurable transceiver may be configured to provide a ground referenced, AC coupled input. In addition, the off-state termination resistance across the differential input terminals of the receive equalizer may be configured to a resistance magnitude of, for example, greater than 200K ohms.

In a second mode of operation, the reconfigurable transceivers may be programmed to support other communication standards, whereby the receive equalizer is configured to provide an AC coupled interface. Furthermore, instead of being referenced to ground potential, the receive equalizer may be configured to support an input signal that is referenced to a non-zero DC potential, i.e., the receive equalizer may be programmably optimized to receive an input signal that exhibits a non-zero DC offset.

For example, a configurable common mode voltage that matches the DC offset of the received signal may be applied to the impedance matching network of the receive equalizer. The AC coupling network of the receive equalizer then removes the non-zero DC offset from the input signal prior to amplification. Once the received signal has been referenced to ground potential by the AC coupling network, the input signal may then be referenced to a configurable DC potential so that the dynamic range of the amplifiers within the receive equalizer may be fully utilized.

In a third mode of operation, still other communication standards may be supported, whereby a DC coupled mode of operation is facilitated. In particular, the impedance matching network of the receive equalizer may be programmably referenced to the same DC potential that is utilized by the transmitting end of the communication link. Further, the AC coupling network may be bypassed, so that the DC offset exhibited by the input signal may be preserved.

Figure 1:
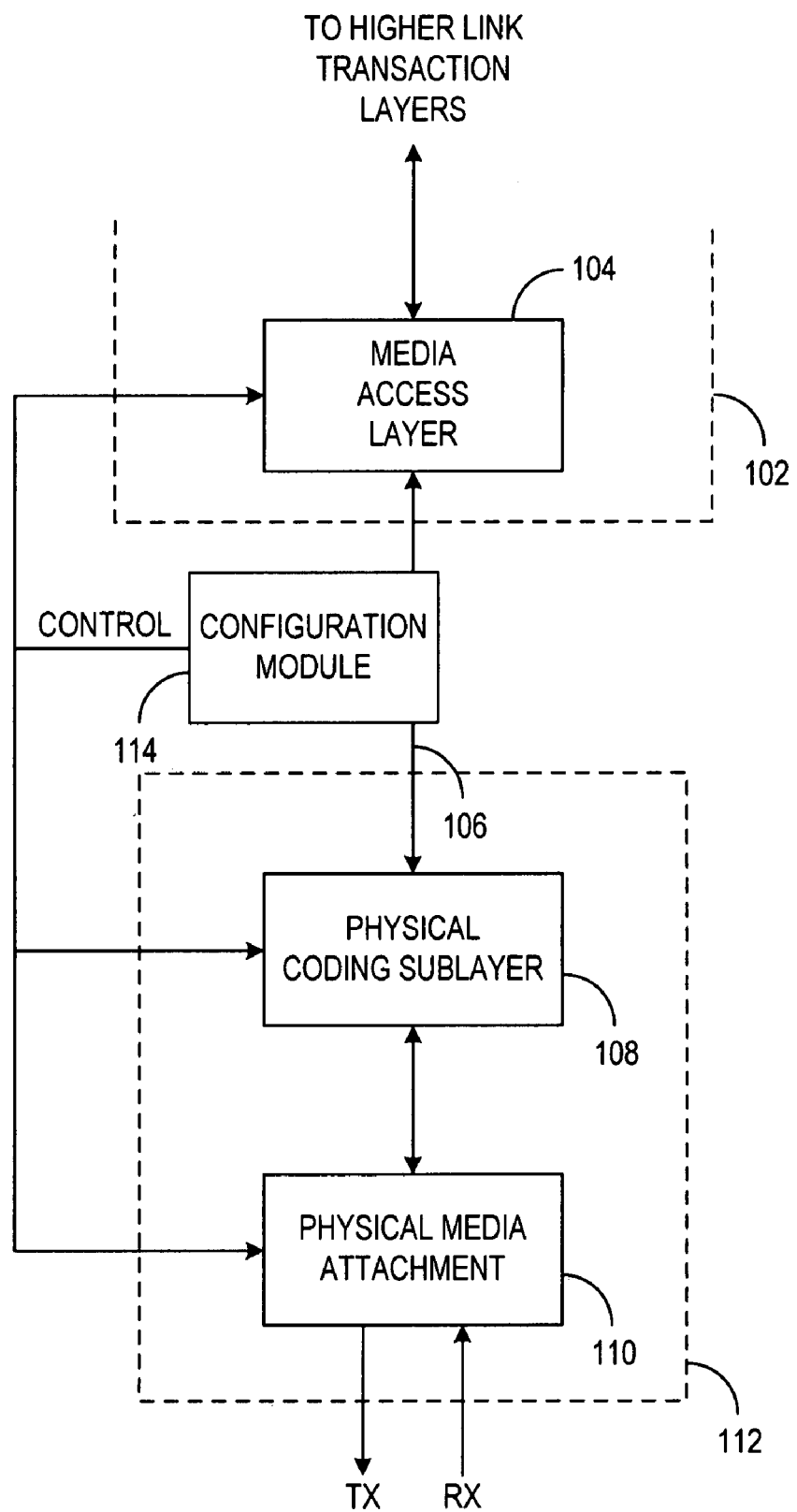
FIG. 1 illustrates an exemplary communication stack for the PHY layer of a gigabit transceiver.

Turning to FIG. 1, an exemplary communication stack is illustrated, whereby PHY layers 102 and 112 are implemented within a programmable logic device (PDL) such as an FPGA. In particular, physical media attachment (PMA) layer 110 and physical coding sublayer (PCS) 108 may reside within a gigabit transceiver of the FPGA, while media access layer (MAC) 104 and the higher link transaction layers may reside within the programmable logic portion, i.e., programmable fabric and associated microprocessing, that also resides within the FPGA.

In one embodiment, PHY layers 102 and 112 may represent a PCIe compliant, PHY interface for a single gigabit transceiver, while other communication channels (not shown) of the FPGA may be simultaneously configured for other communication protocols. PMA 110, for example, provides a serializer/deserializer (SERDES) function whereby parallel data received from PCS 108 may be serialized prior to transmission via the TX interface. Further, serial data received from the RX interface may be converted to parallel data prior to being delivered to PCS 108.

PMA 110 may also incorporate a clock and data recovery (CDR) module whereby a clock signal and a data signal is derived from the input signal received at the RX interface. Once derived, the clock signal may be divided to form a parallel clock signal that is used to propagate the parallel data from PMA 110 to PCS 108 and from PCS 108 to MAC 104 via PHY/MAC interface 106.

MAC 104, PCS 108, and PMA 110 may receive configuration information from configuration module 114. In particular, either during a configuration of the host FPGA, or a partial reconfiguration of portions of the host FPGA and transceiver sections, PHY layers 102 and 112 of the host FPGA may be programmed to accommodate the desired operational attributes of the gigabit transceiver implemented in part by PHY layers 102 and 112.

Figure 2:
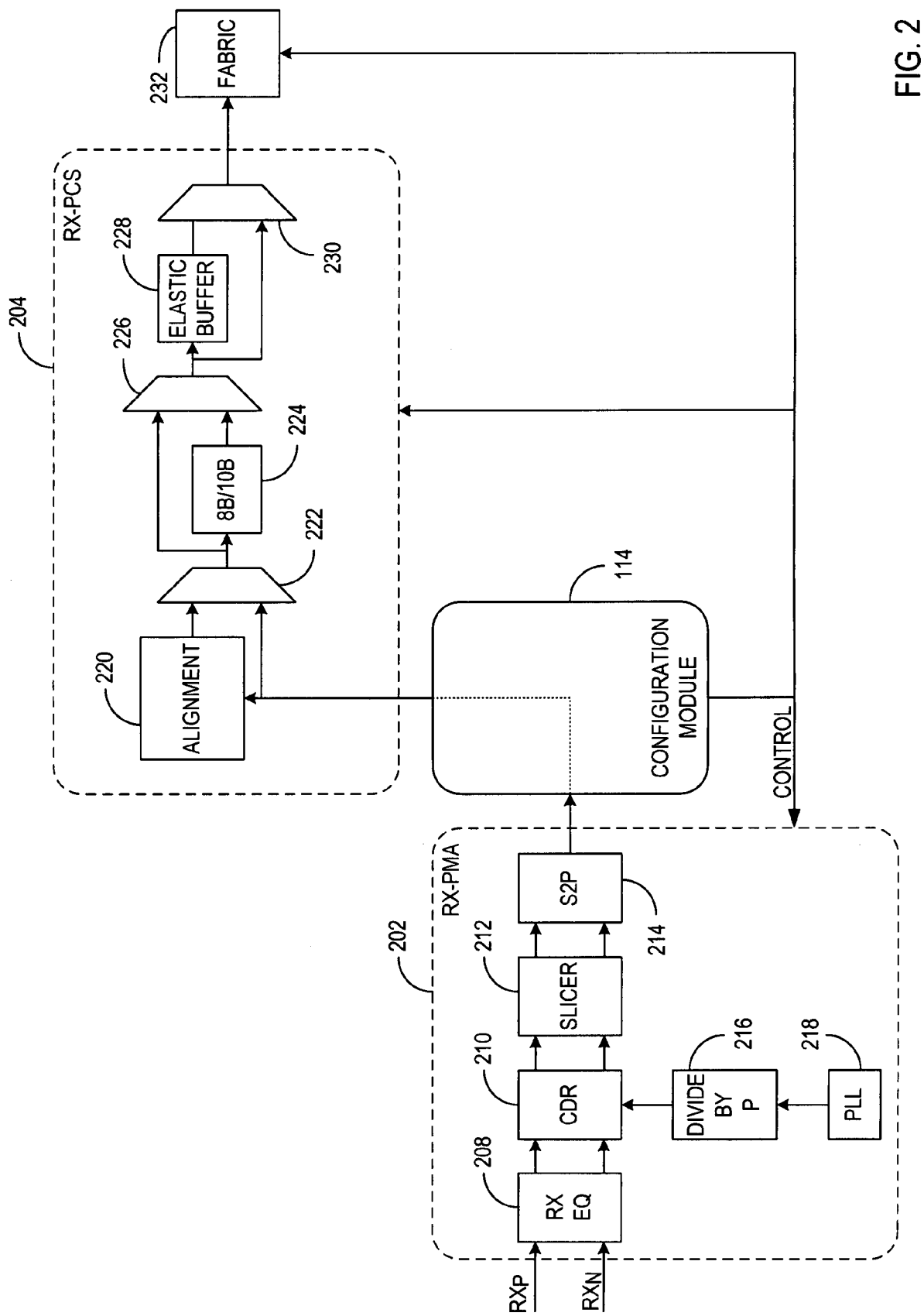
FIG. 2 illustrates an exemplary block diagram of the receive portion of the gigabit transceiver of FIG. 1.

Turning to FIG. 2, an exemplary block diagram of receive-PMA (RX-PMA) 202 and receive-PCS (RX-PCS) 204 of FIG. 1 is illustrated. Receive equalizer 208, as discussed in more detail below, provides the programmable termination networks that select such properties as termination impedance, common mode voltage, and data coupling attributes. The input termination impedance is selectable to account for process variation and to permit various impedance standards to be supported, e.g., 50 ohm and 75 ohm.

The voltage magnitude at the center point of the input impedance termination between $RX_P$ and $RX_N$ may be programmably configured by configuration module 114. In a first mode of operation, for example, the PCIe receiver detect specification may be supported by selecting the voltage magnitude at the center point of the impedance termination to be at ground potential. In a second mode of operation, the center point voltage magnitude may be selected to one or more intermediate voltage levels in support of various communication protocols that require a programmable common mode voltage range. In a third mode of operation, the center point voltage magnitude may be selected to the common mode voltage level that is being utilized by the differential transmitter (not shown) that is providing data to receive equalizer 208.

Clock and data recovery block 210, divide by P 216, and phase lock loop (PLL) 218 combine to extract clock rate and data information from the $RX_P$ and $RX_N$ input terminals. Once the transmission clock rate is extracted, PLL 218 is utilized to track frequency and/or phase drift that may be present on the transmission clock. Slicer 212 and serial to parallel converter (S2P) 214 combine to detect the logic value of each data bit of the input data stream and to align the data bits into data words of variable width, e.g., 8-bit or 10-bit, data words.

PLL 218 may instead provide a detection clock that is not synchronized to the transmission clock rate, but is instead synchronized to an internal reference clock (not shown). In such instances, a disparity may exist between the transmitted data frequency and the detection clock frequency as provided by PLL 218. Elastic buffer 228 may, therefore, be utilized to compensate for such frequency differences. Elastic buffer 228 is, however, a source of data latency, thus elastic buffer 228 may be bypassed using appropriate select logic for multiplexer 230 via configuration module 114.

Bit alignment, or comma detection, within each data word may be optionally implemented via alignment block 220. In particular, the bit position of each bit of the data word may be rotated within a barrel shifter to achieve, for example, one of 8 bit alignments for an 8-bit data word, or one of 10 bit alignments for a 10-bit data word. If no alignment is required, alignment block 220 may be bypassed using appropriate select logic for multiplexer 222 via configuration module 114.

The input data signal may be encoded using, for example, an 8 B/10 B line code, whereby a DC balance is guaranteed in order to enhance clock and data recovery at block 210 when AC coupling is utilized by receive equalizer 208. If 8 B/10 B encoding is not utilized, 8 B/10 B decoding block 224 may be bypassed using appropriate select logic for multiplexer 226 via configuration module 114.

As discussed above, RX-PMA 202 and RX-PCS 204 may form the receive portion of a single gigabit transceiver channel of an IC, such as a PLD. One type of PLD, the FPGA, typically includes an array of programmable tiles contained within fabric 232. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth. Thus, the logic elements of fabric 232, along with associated microprocessing, may be configured to implement the higher link transaction layers of FIG. 1.

Figure 3:
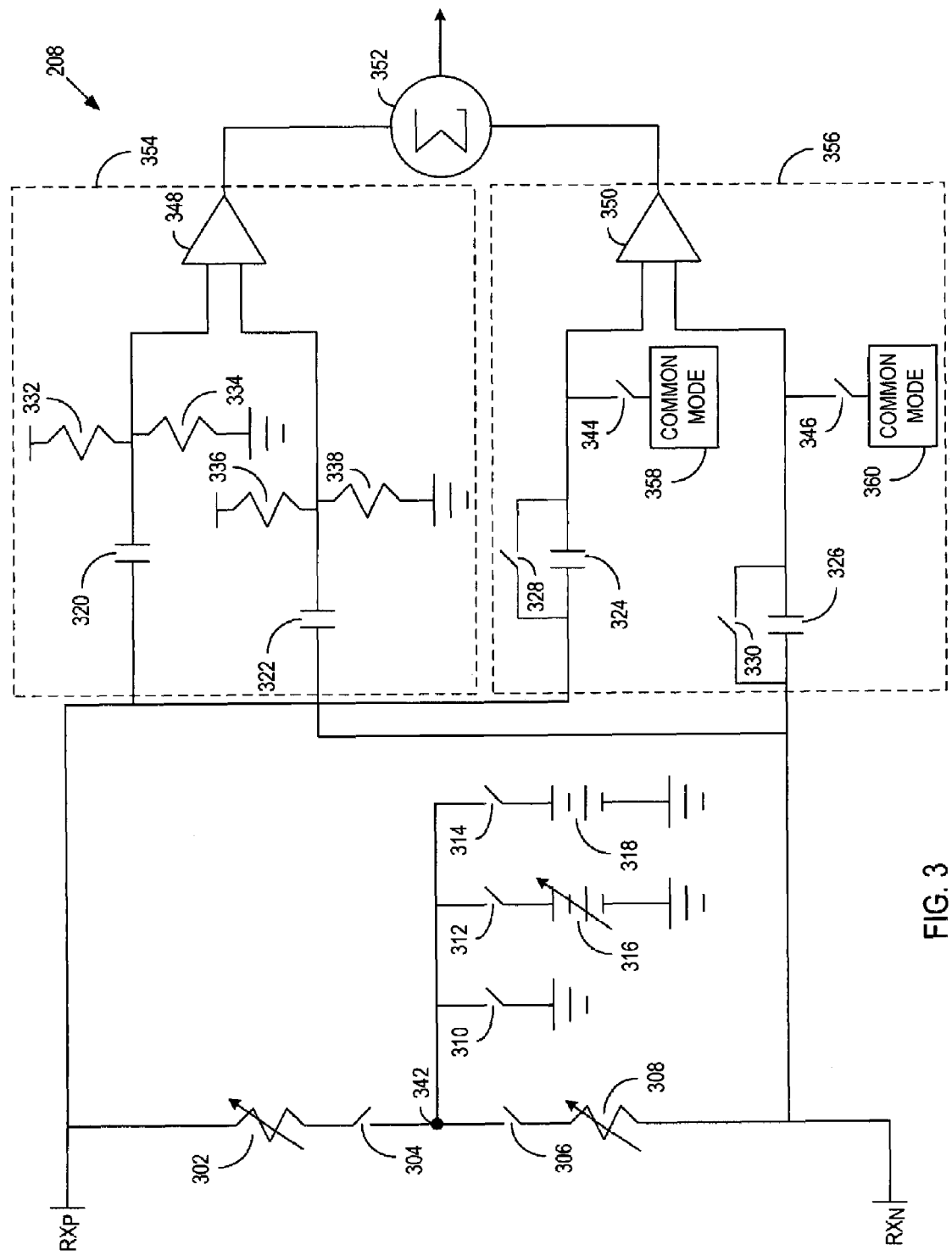
FIG. 3 illustrates an exemplary schematic diagram of the programmable receive equalizer of FIG. 2.

Turning to FIG. 3, an exemplary schematic diagram of programmable receive equalizer 208 is illustrated. A differential signal is received at terminals $RX_P$ and $RX_N$, whereby the characteristic impedance of the transmission medium used to transmit the differential signal is terminated by a configurable input impedance across terminals $RX_P$ and $RX_N$. In particular, the resistance magnitude of programmable resistance elements 302 and 306 may be configured by configuration module 114 during a configuration, or a partial reconfiguration event, in order to conform to the termination impedance as required by the transmission medium being used. Termination impedance values may be configured to, for example, 50 ohms (100 ohms differential) or 75 ohms (150 ohms differential).

Furthermore, the voltage magnitude at the center point, i.e., node 342, may be selected to support one of several common modes of operation as may be required by the communication protocol being supported. In particular, switch 310 may be closed in order to select the voltage magnitude at node 342 to ground potential in support of, for example, the PCIe standard. Other communication protocols may instead require a variable common mode voltage as may be provided by variable power supply 316 via switch 312. In one embodiment, variable power supply 316 may be configured to provide a fraction, e.g., ⅔, of the receiver power supply voltage to node 342. Still other communication protocols may utilize a fixed supply voltage, i.e., non-variable, as supplied by receiver power supply 318 via switch 314.

Further in support of the PCIe standard, for example, switches 304 and 306 may be configured to their open position by configuration module 114 during a power off mode of receive equalizer 208. By selecting the open circuit resistance of switches 304 and 306 to be greater than a minimum impedance, e.g., 200K ohms, the PCIe power off input impedance specification may be supported.

Receive equalizer 208 may be implemented as the summation of wideband data path 356 and high-pass data path 354 via summation block 352. The amount of signal power from each of the high-pass and wideband data paths that is summed may be selected by summer 352 according to a mix ratio that is selected by configuration module 114. Other settings, such as equalizer pole settings, may also be selected by configuration module 114.

Inputs to amplifier 348 are derived from input terminals $RX_P$ and $RX_N$ via a first high pass filter comprised of capacitor 320 and resistive elements 332-334 and a second high-pass filter comprised of capacitor 322 and resistive elements 336-338. Capacitors 320-322 and resistive elements 332-338 are configured in such a way as to reject low frequency spectra while passing high frequency spectra, whereby the RC time constant is set so as to avoid severe signal attenuation in the passband of each high pass filter.

The common mode voltage magnitude at the inputs of amplifier 348 are set by the resistive dividers 332/334 and 336/338, where first conductors of resistive elements 332 and 336 are coupled to the receiver power supply and first conductors of resistive elements 334 and 338 are coupled to, for example, ground potential. The common mode voltage applied to the inputs of amplifier 348 is, therefore, set by the voltage at the common connection points between resistive elements 332/334 and 336/338 and is proportional to the resistance magnitude of resistive elements 332/334 and 336/338, respectively.

Inputs to amplifier 350 are derived from input terminals $RX_P$ and $RX_N$ via a first AC coupling capacitor 324 and a second AC coupling capacitor 326, respectively. Capacitors 324 and 326 are configured in such a way as to provide a much wider bandwidth as compared to the high-pass filters of high-pass data path 354. In addition, switches 328 and 330 are implemented in parallel with capacitors 324 and 326, respectively, so as to enable/disable AC coupling. That is to say, for example, that when switches 328 and 330 are closed, capacitors 324 and 326 are short circuited to provide a DC path to amplifier 350, thus disabling the AC coupling mode. If switches 328 and 330 are open, on the other hand, then capacitors 324 and 326 are enabled to provide an AC coupled path to amplifier 350.

The common mode voltage applied to the inputs of amplifier 350 is set by common mode voltage blocks 358 and 360 when the wideband data path is operating in an AC coupled mode of operation. That is to say, for example, that when switches 328 and 330 are open circuited (AC coupled mode of operation), then switches 344 and 346 are closed in order to apply the common mode voltage from common mode voltage blocks 358 and 360 to the input transistor pair of amplifier 350. In such an instance, the signal input to the transistor pair of amplifier 350 is maintained within an appropriate dynamic range so as to keep the transistor pair in its active region.

Turning to Table 1, the various operating modes and associated programmable configuration settings for receive equalizer 208 are tabulated. The first configuration of Table 1 allows conformance to the PCIe specification. In particular, switch 310 is closed and switches 312-314 are open to apply ground potential to node 342, which allows for ground referenced signaling to be applied to terminals $RX_P$ and $RX_N$. Further, switches 304 and 306 may be configured to an open state during power off operation, so that the impedance across terminals $RX_P$ and $RX_N$ may exceed 200K ohms. Otherwise, switches 304 and 306 remain closed during all other operational states. Switches 328 and 330 remain open so as to provide an AC coupled mode of operation within wideband data path 356. As such, switches 344 and 346 remain closed to allow an appropriate common mode voltage level to be applied to amplifier 350.

TABLE 1

| Switch 310 | Switch 312 | Switch 314 | Switch 328/330 | Switch 344/346 | Mode Of operation |
| --- | --- | --- | --- | --- | --- |
| Closed | Open | Open | Open | Closed | PCIe |
| Open | Open | Closed | Open | Closed | AC coupled DC balanced #1 |
| Open | Closed | Open | Open | Closed | AC coupled DC balanced #2 |
| Open | Open | Closed | Closed | Open | DC coupled |

The second configuration of Table 1 allows conformance to other communication standards that require DC balanced data to be applied to terminals $RX_P$ and $RX_N$, whereby the common mode voltage at node 342 is supplied by fixed voltage supply 318 via switch 314 and switches 310-312 remain open circuited. In one embodiment, the voltage magnitude of fixed voltage supply 318 is equal to the voltage magnitude of the receiver power supply. Switches 328 and 330 remain open so as to provide an AC coupled mode of operation within wideband data path 356. As such, switches 344 and 346 remain closed to allow an appropriate common mode voltage level to be applied to amplifier 350.

The third configuration of Table 1 allows conformance to other communication standards that require DC balanced data to be applied to terminals $RX_P$ and $RX_N$, whereby the common mode voltage at node 342 is supplied by variable voltage supply 316 via switch 312. As such, switches 310 and 314 are open circuited. In one embodiment, the voltage magnitude of voltage supply 316 may be set to a fraction, e.g., ⅔, of the voltage magnitude of the receiver's power supply. Switches 328 and 330 remain open so as to provide an AC coupled mode of operation within wideband data path 356. As such, switches 344 and 346 remain closed to allow an appropriate common mode voltage level to be applied to amplifier 350.

The fourth configuration of Table 1 allows conformance to other communication standards that require DC balanced data to be applied to terminals $RX_P$ and $RX_N$, whereby the common mode voltage at node 342 is supplied by fixed voltage supply 318 via switch 314. As such, switches 310-312 are open circuited. Switches 328 and 330 are closed so as to provide a DC coupled mode of operation within wideband data path 356. As such, switches 344 and 346 are open to allow the common mode voltage level to be applied to amplifier 350 by fixed voltage supply 318.

It is understood that the configurable aspects of receive equalizer 208 may be activated using P-type and or N-type field effect transistors (FETs) in place of switches 304-306, 310-314, 326-328, and 344-346. In such instances, appropriate voltage levels at the gate terminals of each transistor switch may be applied by configuration module 114 to effect either an open circuit or closed circuit state for each transistor switch as required by Table 1. Bipolar transistors may also be used in place of switches 304-306, 310-314, 326-328, and 344-346.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit (IC), comprising:
    a configurable logic fabric coupled to receive configuration data, the configurable logic fabric including programmable logic devices and programmable interconnections that are configured to perform a logic function in response to the configuration data; and
    a transceiver coupled to the configurable logic fabric and coupled to receive a differential signal and the configuration data, the transceiver including,
        a receive interface coupled to receive the differential signal at first and second terminals, the receive interface being adapted to internally apply a programmable common mode signal to the first and second terminals in response to the configuration data; and
        a receive equalizer coupled to the receive interface and adapted to sum first and second phases of the differential signal.

2. The IC of claim 1, wherein the receive interface comprises a first programmable resistive element coupled to the first terminal and a first node, wherein a resistance magnitude of the first programmable resistive element is selected in response to the configuration data.

3. The IC of claim 2, wherein the receive interface further comprises a second programmable resistive element coupled to the second terminal and the first node, wherein a resistance magnitude of the second programmable resistive element is selected in response to the configuration data.

4. The IC of claim 3, wherein the receive interface further comprises:
    a first switch having a first conductor coupled to the first node; and
    a reference voltage supply coupled to a second conductor of the first switch, wherein the conductive state of the first switch is selected in response to the configuration data.

5. The IC of claim 4, wherein the receive interface further comprises:
    a second switch having a first conductor coupled to the first node; and
    a variable voltage supply coupled to a second conductor of the second switch, wherein the conductive state of the second switch is selected in response to the configuration data.

6. The IC of claim 5, wherein the receive interface further comprises:
    a third switch having a first conductor coupled to the first node; and
    a fixed voltage supply coupled to a second conductor of the third switch, wherein the conductive state of the third switch is selected in response to the configuration data.

7. The IC of claim 6, wherein the receive equalizer comprises:
    a high-pass data path coupled to the first and second terminals, the high-pass data path adapted to apply a first filtering operation to the differential signal to produce a first filtered signal;
    a wideband data path coupled to the first and second terminals, the wideband data path adapted to apply a second filtering operation to the differential signal to produce a second filtered signal; and
    a summer coupled to outputs of the high-pass data path and the wideband data path and adapted to sum the first and second filtered signals.

8. The IC of claim 7, wherein the wideband data path comprises:
    a first capacitor having a first conductor coupled to the first terminal and a second conductor coupled to a second node; and
    a fourth switch having a first conductor coupled to the first terminal and a second conductor coupled to the second node, the fourth switch adapted to short circuit the first capacitor in response to the configuration data.

9. The IC of claim 8, wherein the wideband data path further comprises:
    a fifth switch having a first conductor coupled to the second node; and
    a first common mode voltage block coupled to a second conductor of the fifth switch, wherein the fifth switch is adapted to couple an output of the first common mode voltage block to the second node in response to the configuration data.

10. The IC of claim 9, wherein the wideband data path further comprises:
    a second capacitor having a first conductor coupled to the second terminal and a second conductor coupled to a third node; and
    a sixth switch having a first conductor coupled to the second terminal and a second conductor coupled to the third node, the sixth switch adapted to short circuit the second capacitor in response to the configuration data.

11. The IC of claim 10, wherein the wideband data path further comprises:
a seventh switch having a first conductor coupled to the third node; and
a second common mode voltage block coupled to a second conductor of the seventh switch, wherein the seventh switch is adapted to couple an output of the second common mode voltage block to the third node in response to the configuration data.

12. An integrated circuit, comprising:
a transceiver coupled to receive a differential signal and coupled to receive configuration data during a configuration event of the integrated circuit, the transceiver including,
a receive interface coupled to receive the differential signal at first and second terminals, the receive interface being adapted to internally apply a programmable common mode signal to a first node in response to the configuration data, wherein the first node is coupled to the first and second terminals through first and second programmable resistive elements; and
a receive equalizer coupled to the receive interface and adapted to sum first and second phases of the differential signal.

13. The integrated circuit of claim 12, wherein the receive interface comprises:
a first switch having a first conductor coupled to the first node; and
a reference voltage supply coupled to a second conductor of the first switch, wherein an output of the reference voltage supply is coupled to the first node via the first switch in response to the configuration data.

14. The integrated circuit of claim 13, wherein the receive interface further comprises:
a second switch having a first conductor coupled to the first node; and
a variable voltage supply coupled to a second conductor of the second switch, wherein an output of the variable voltage supply is coupled to the first node via the second switch in response to the configuration data.

15. The integrated circuit of claim 14, wherein the receive interface further comprises:
a third switch having a first conductor coupled to the first node; and
a fixed voltage supply coupled to a second conductor of the third switch, wherein an output of the fixed voltage supply is coupled to the first node via the third switch in response to the configuration data.

16. The integrated circuit of claim 15, wherein the receive equalizer comprises:
a high-pass data path coupled to the first and second terminals, the high-pass data path adapted to apply a first filtering operation to the differential signal to produce a first filtered signal;
a wideband data path coupled to the first and second terminals, the wideband data path adapted to apply a second filtering operation to the differential signal to produce a second filtered signal; and
a summer coupled to outputs of the high-pass data path and the wideband data path and adapted to sum the first and second filtered signals.

17. The integrated circuit of claim 16, wherein the wideband data path comprises:
a first capacitor having a first conductor coupled to the first terminal and a second conductor coupled to a second node;
a fourth switch having a first conductor coupled to the first terminal and a second conductor coupled to the second node, the fourth switch adapted to short circuit the first capacitor in response to the configuration data;
a fifth switch having a first conductor coupled to the second node; and
a first common mode voltage block coupled to a second conductor of the fifth switch, wherein the fifth switch is adapted to couple an output of the first common mode voltage block to the second node in response to the configuration data.

18. The integrated circuit of claim 17, wherein the wideband data path further comprises:
a second capacitor having a first conductor coupled to the second terminal and a second conductor coupled to a third node;
a sixth switch having a first conductor coupled to the second terminal and a second conductor coupled to the third node, the sixth switch adapted to short circuit the second capacitor in response to the configuration data;
a seventh switch having a first conductor coupled to the third node; and
a second common mode voltage block coupled to a second conductor of the seventh switch, wherein the seventh switch is adapted to couple an output of the second common mode voltage block to the third node in response to the configuration data.

19. A transmission system, comprising:
a receiver coupled to receive differential data from a transmission medium, the receiver including,
a configurable logic fabric coupled to receive configuration data, the configurable logic fabric including programmable logic devices and programmable interconnections that are configured to perform a logic function in response to the configuration data;
a receive interface coupled to receive the differential data at first and second terminals, the receive interface being adapted to internally apply a programmable common mode signal in response to the configuration data; and
a receive equalizer coupled to the receive interface and adapted to sum first and second phases of the differential data.

20. The transmission system of claim 19, wherein the receive interface comprises:
a first switch coupled to the first terminal and a first node; and
a second switch coupled to the second terminal and the first node, wherein the first and second switches are open circuited in a power off state of the receiver to provide a resistance across the first and second terminals that exceeds a minimum resistance magnitude.

* * * * *